(12) United States Patent
Cismaru et al.

(10) Patent No.: US 10,439,051 B2
(45) Date of Patent: Oct. 8, 2019

(54) METHODS RELATED TO A SEMICONDUCTOR STRUCTURE WITH GALLIUM ARSENIDE AND TANTALUM NITRIDE

(71) Applicant: Skyworks Solutions, Inc., Woburn, MA (US)

(72) Inventors: Cristian Cismaru, Newbury Park, CA (US); Peter J. Zampardi, Jr., Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/809,292

(22) Filed: Nov. 10, 2017

(65) Prior Publication Data
US 2018/0204934 A1     Jul. 19, 2018

Related U.S. Application Data

(62) Division of application No. 13/678,262, filed on Nov. 15, 2012, now Pat. No. 9,847,407.
(Continued)

(51) Int. Cl.
*H01L 29/06* (2006.01)
*H01L 29/47* (2006.01)
(Continued)

(52) U.S. Cl.
CPC ............ *H01L 29/68* (2013.01); *H01L 29/475* (2013.01); *H01L 29/66007* (2013.01); *H01L 29/66212* (2013.01); *H01L 29/66318* (2013.01); *H01L 29/73* (2013.01); *H01L 29/872* (2013.01); *H01L 31/02002* (2013.01); *H01L 29/0692* (2013.01);
(Continued)

(58) Field of Classification Search
None
See application file for complete search history.

(56) References Cited

U.S. PATENT DOCUMENTS

| 3,233,196 A | 2/1966 | Hiroe et al. | |
| 4,461,956 A * | 7/1984 | Hatanaka | H01L 27/14665 250/208.1 |

(Continued)

FOREIGN PATENT DOCUMENTS

| EP | 1662557 A1 | 5/2006 |
| JP | 2005-116773 A | 4/2005 |

(Continued)

OTHER PUBLICATIONS

U.S. Appl. No. 13/675,814, filed Nov. 13, 2002, Devices and Methods Related to a Barrier of Gallium Based Semiconductor.
(Continued)

*Primary Examiner* — Nishath Yasmeen
(74) *Attorney, Agent, or Firm* — Knobbe, Martens, Olson & Bear, LLP (57) ABSTRACT

Disclosed are structures and methods related to metallization of a gallium arsenide (GaAs) layer. In some embodiments, a tantalum nitride (TaN) layer can be formed on a doped GaAs layer, and a metal layer can be formed on the TaN layer. Such a structure can be included in a Schottky diode. In some embodiments, such a Schottky diode can be fabricated utilizing heterojunction bipolar transistor (HBT) processes.

20 Claims, 8 Drawing Sheets

Related U.S. Application Data (60) Provisional application No. 61/560,394, filed on Nov. 16, 2011.

(51) Int. Cl.
*H01L 29/66* (2006.01)
*H01L 29/68* (2006.01)
*H01L 29/73* (2006.01)
*H01L 31/02* (2006.01)
*H01L 29/872* (2006.01)

(52) U.S. Cl.
CPC .......... *H01L 2224/05554* (2013.01); *H01L 2224/48091* (2013.01); *H01L 2224/48227* (2013.01); *H01L 2224/49171* (2013.01); *H01L 2924/15184* (2013.01)

(56) References Cited

U.S. PATENT DOCUMENTS

| | | | |
|---|---|---|---|
| 4,745,445 A * | 5/1988 | Mun | H01L 21/26546 257/275 |
| 4,751,201 A | 6/1988 | Nottenburg et al. | |
| 4,871,686 A | 10/1989 | Davies | |
| 4,920,078 A | 4/1990 | Bagley et al. | |
| 4,933,732 A | 6/1990 | Katoh et al. | |
| 4,939,562 A | 7/1990 | Alderstein | |
| 5,378,922 A | 1/1995 | Sovero | |
| 5,455,440 A | 10/1995 | Henderson et al. | |
| 5,585,300 A | 12/1996 | Summerfelt | |
| 5,670,801 A | 9/1997 | Nakano | |
| 5,837,589 A * | 11/1998 | McNamara | H01L 27/0605 438/314 |
| 5,864,169 A | 1/1999 | Shimura | |
| 5,932,911 A | 8/1999 | Yue et al. | |
| 5,986,324 A | 11/1999 | Adlerstein et al. | |
| 6,388,526 B1 * | 5/2002 | Daniel | H03G 3/3068 330/136 |
| 6,392,258 B1 | 5/2002 | Hirata et al. | |
| 6,406,965 B1 * | 6/2002 | Lammert | H01L 27/0664 257/E21.359 |
| 6,465,289 B1 * | 10/2002 | Streit | H01L 21/8252 257/E21.697 |
| 6,576,937 B2 | 6/2003 | Takazawa | |
| 6,673,687 B1 | 1/2004 | Burton et al. | |
| 6,680,494 B2 | 1/2004 | Gutierrez-Aitken | |
| 6,803,643 B2 | 10/2004 | Winslow | |
| 6,913,938 B2 | 7/2005 | Shanmugasundram et al. | |
| 7,082,346 B2 | 7/2006 | Saki et al. | |
| 7,109,408 B2 | 9/2006 | Kucherov et al. | |
| 7,109,534 B2 | 9/2006 | Kondo | |
| 7,242,038 B2 | 7/2007 | Oda et al. | |
| 7,420,227 B2 | 9/2008 | Chang et al. | |
| 7,875,523 B1 | 1/2011 | Fields | |
| 8,082,054 B2 | 12/2011 | Yamaji | |
| 9,461,153 B2 | 10/2016 | Cismaru et al. | |
| 9,847,407 B2 | 12/2017 | Cismaru et al. | |
| 10,121,780 B2 | 11/2018 | Cismaru et al. | |
| 2001/0016377 A1 * | 8/2001 | Mizutani | H01L 21/8252 438/167 |
| 2001/0048120 A1 | 12/2001 | Shimawaki | |
| 2003/0017256 A1 | 1/2003 | Shimane | |
| 2003/0038341 A1 | 2/2003 | Bayraktaroglu | |
| 2003/0073255 A1 | 4/2003 | Narayanan et al. | |
| 2003/0157775 A1 * | 8/2003 | Kurokawa | H01L 21/8252 438/312 |
| 2003/0183846 A1 | 10/2003 | Oguri | |
| 2003/0213973 A1 | 11/2003 | Yoshioka et al. | |
| 2004/0016941 A1 | 1/2004 | Yanagisawa et al. | |
| 2004/0149330 A1 | 8/2004 | Sergoyan et al. | |
| 2005/0029625 A1 | 2/2005 | Hussain et al. | |
| 2005/0035370 A1 | 2/2005 | Chen | |
| 2005/0134293 A1 | 6/2005 | Sergoyan et al. | |
| 2005/0269594 A1 | 12/2005 | Chen et al. | |
| 2006/0054998 A1 | 3/2006 | Chantre et al. | |
| 2006/0138460 A1 | 6/2006 | Sasaki et al. | |
| 2006/0226444 A1 * | 10/2006 | Feng | H01L 29/66318 257/197 |
| 2006/0267047 A1 | 11/2006 | Murayama | |
| 2006/0289896 A1 | 12/2006 | Miyamoto et al. | |
| 2007/0012949 A1 | 1/2007 | Kawashima et al. | |
| 2007/0023783 A1 | 2/2007 | Hase et al. | |
| 2007/0040274 A1 | 2/2007 | Lee et al. | |
| 2007/0045774 A1 | 3/2007 | Huber et al. | |
| 2007/0205430 A1 | 9/2007 | Collins et al. | |
| 2007/0205432 A1 | 9/2007 | Tsukao | |
| 2007/0210340 A1 | 9/2007 | Zampardi et al. | |
| 2008/0054370 A1 | 3/2008 | Naito et al. | |
| 2008/0073752 A1 | 3/2008 | Asai et al. | |
| 2008/0088020 A1 | 4/2008 | Miyajima et al. | |
| 2008/0230807 A1 | 9/2008 | Kuroda et al. | |
| 2009/0130996 A1 | 5/2009 | Kudaishi et al. | |
| 2009/0153237 A1 | 6/2009 | Tanzawa | |
| 2009/0309134 A1 | 12/2009 | Nishio et al. | |
| 2010/0181674 A1 | 7/2010 | Tabatabaie et al. | |
| 2011/0193191 A1 | 8/2011 | Bito | |
| 2012/0038385 A1 | 2/2012 | Eaglesham et al. | |
| 2012/0061802 A1 | 3/2012 | Nicholas et al. | |
| 2012/0218047 A1 | 8/2012 | Costa et al. | |
| 2013/0099287 A1 | 4/2013 | Moser et al. | |
| 2013/0137199 A1 | 5/2013 | Cismaru et al. | |
| 2013/0137382 A1 | 5/2013 | Cismaru et al. | |
| 2016/0358907 A1 | 12/2016 | Cismaru et al. | |

FOREIGN PATENT DOCUMENTS

| | | | |
|---|---|---|---|
| KR | 10-2008-054040 B1 | 8/2008 | |
| WO | WO 2004/084272 A2 | 9/2004 | |

OTHER PUBLICATIONS

U.S. Appl. No. 13/675,878, filed Nov. 13, 2002, Systems and Methods for Monitoring Heterojunction Bipolar Transistor Processes.

Fu et al. "Comprehensive investigation on emitter ledge length of InGaP/GaAs heterojunction bipolar transistors," J. Vac. Sci. Technol. B 25(3) May/Jun. 2007, pp. 691-696.

Spicer, et al., "Unified Mechanism for Schottky-Barrier Formation and III-V Oxide Interface States", Physical Review Letters, vol. No. 6, Feb. 11, 1980, pp. 420-423.

Malik, et al., "Planar-Doped Barriers in GaAs by Molecular Bam Epitaxy", Electronics Letters, vol. 16, No. 22, Oct. 23, 1980, pp. 836-838.

Kapoor, et al., "Tantalum Nitride-p-Silicon High-Voltage Schottky Diodes", IEEE Transactions on Electron Devices, vol. 35, No. 8, Aug. 1988, pp. 1372-1377.

Chen et al., "Backside Copper Metallization of GaAs MESFETs Using TaN as the Diffusion Barrier," *IEEE Trans. on Electron Devices* vol. 48, No. 6, pp. 1033-1036, Jun. 2001.

Cismaru et al., Low Turn-On Voltage Schottky Diode in InGaP/GaAs HBT/BiFET Processes, CS MANTECH Conference, May 13-16, 2013, New Orleans, Louisiana, USA, p. 149-152.

Geppert et al., "Correlation of Metal-Semiconductor Barrier Height and Metal Work Function; Effects of Surface States," *Journal of Applied Physics* vol. 37, No. 6, pp. 2458-2467, 1966.

Holloway et al., "Tantalum as a diffusion barrier between copper and silicon: Failure mechanism and effect of nitrogen additions," *Journal of Applied Physics*, vol. 71, No. 7, 5433-5444, 1992.

International Search Report and Written Opinion re International Application No. PCT/US2012/065090 dated Apr. 1, 2013.

Mehal et al., "GaAs Integrated Microwave Circuits," *IEEE Trans. on Microwave Theory and Techniques* vol. MTT-16, No. 7, pp. 451-454, 1968.

Missous et al., "On the Richardson constant of intimate metal-GaAs Schottky barriers," *Semicond. Sci. Technol.* 7, pp. 218-221, 1992.

Padovani, Chapter 2: The Voltage-Current Characteristics of Metal-Semiconductor Contacts, Semiconductors and Semimetals, vol. 7, Part. A, pp. 75-146, 1971.

(56) References Cited

OTHER PUBLICATIONS

Tam et al., Experimental Richardson Constant of Metal-Semiconductor Schottky Barrier Contacts, *Phys. Stat. Sol.* (a)93, pp. K 91-K 95, 1986.

Wu et al., "Modulation of Schottky Barrier Height of Metal/TaN/n-Ge Junctions by Varying TaN Thickness," *IEEE Trans. Electron Devices* vol. 59, No. 5, pp. 1328-1331, May 2012.

Zampardi et al., "Methods for Monitoring Passivation Ledges in a Manufacturing Environment," 2002 GaAsMANTECH Conference, 4 pages.

\* cited by examiner

METHODS RELATED TO A SEMICONDUCTOR STRUCTURE WITH GALLIUM ARSENIDE AND TANTALUM NITRIDE

CROSS-REFERENCE TO RELATED APPLICATIONS

This application is a divisional of U.S. patent application Ser. No. 13/678,262, filed Nov. 15, 2012 and entitled "DEVICES AND METHODS RELATED TO A GALLIUM ARSENIDE SCHOTTKY DIODE HAVING LOW TURN-ON VOLTAGE," which claims priority to U.S. Provisional Application No. 61/560,394, filed Nov. 16, 2011 and entitled "DEVICES AND METHODOLOGIES RELATED TO A GaAs SCHOTTKY DIODE HAVING LOW TURN-ON VOLTAGE," the disclosures of each of which are expressly incorporated by reference herein in their entireties.

BACKGROUND

Field

The present disclosure generally relates to structures and fabrication processes associated with heterojunction bipolar transistors and Schottky diodes.

Description of the Related Art

A bipolar junction transistor (BJT) typically includes two back-to-back p-n junctions formed by a base region disposed between an emitter region and a collector region. Such junctions can include a PNP configuration or an NPN configuration. The bipolar functionality results from its operation involving both electrons and holes.

A heterojunction bipolar transistor (HBT) is a type of BJT, where different semiconductor materials are utilized for the emitter and base regions to yield a heterojunction. Such a configuration can allow HBTs to be particularly useful in radio-frequency (RF) applications, including high-efficiency RF power amplifiers.

A Schottky diode is a semiconductor diode having a Schottky barrier resulting from a junction between a metal and a semiconductor. Such a diode has desirable properties such as relatively low forward voltage drop and relatively fast switching time.

SUMMARY

In some implementations, the present disclosure relates to a semiconductor structure that includes a gallium arsenide (GaAs) substrate and a collector layer formed over the GaAs substrate. The structure further includes a tantalum nitride (TaN) layer formed over the collector layer.

In some embodiments, the semiconductor structure can further include a sub-collector layer formed between the collector layer and the GaAs substrate. In some embodiments, the semiconductor structure can further include a first electrical contact formed on the TaN layer and a second electrical contact formed on the sub-collector layer. Such a structure can be a Schottky diode, with the first electrical contact being an anode and the second electrical contact being a cathode. The first electrical contact can include an M1 metal layer, and the second electrical contact can include a collector contact and an M1 metal layer.

In some embodiments, the TaN layer can be configured to lower a turn-on voltage of the Schottky diode. In some embodiments, the turn-on voltage can be less than 0.5V.

In some embodiments, the collector layer can include n− GaAs, and the sub-collector layer can include n+ GaAs. In some embodiments, the GaAs substrate can include semi-insulating GaAs.

According to a number of implementations, the present disclosure relates to a method for fabricating a semiconductor structure. The method includes providing a gallium arsenide (GaAs) substrate and forming a collector layer over the GaAs substrate. The method further includes forming a tantalum nitride (TaN) layer over the collector layer.

In some embodiments, the method can further include forming a sub-collector layer prior to the forming of the collector layer such that the collector layer is over the sub-collector layer. In some embodiments, the method can further include forming a first electrical contact on the TaN layer and a second electrical contact on the sub-collector layer to yield a Schottky diode, with the first electrical contact being an anode and the second electrical contact being a cathode.

In a number of teachings, the present disclosure relates to an electronic module that includes a packaging substrate configured to receive one or more components. The module further includes a semiconductor device mounted on the packaging substrate. The semiconductor device includes a gallium arsenide (GaAs) substrate, a doped GaAs layer formed over the GaAs substrate, and a tantalum nitride (TaN) layer formed over the doped GaAs layer.

In some embodiments, the semiconductor device can further include a first electrical contact connected to the TaN layer and a second electrical contact connected to the sub-collector layer, with the first and the second contacts being an anode and a cathode, respectively, of a Schottky diode. In some embodiments, the semiconductor device can be, for example, a radio-frequency (RF) power detector, a clamp diode configured for generating a reference voltage. In some embodiments, the module can be a photoelectric cell.

In some embodiments, the Schottky diode can have a turn-on voltage that is less than 0.5V. In some embodiments, the doped GaAs layer can be a collector layer formed during a heterojunction bipolar transistor (HBT) process.

According to a number of implementations, the present disclosure relates to a Schottky diode having a gallium arsenide (GaAs) layer. The Schottky diode further includes a tantalum nitride (TaN) layer disposed over the GaAs layer, and a metal layer disposed over the TaN layer.

In some embodiments, the GaAs layer can include an n-type GaAs layer. In some embodiments, the metal layer can form an anode of the Schottky diode. In some embodiments, the Schottky diode can further include an anode interconnected to the GaAs layer.

In some embodiments, the TaN layer can be configured so as to lower the Schottky diode's turn-on voltage. Such a turn-on voltage is less than about 0.6V or about 0.5V.

In some embodiments, the Schottky diode can be part of a solar cell. In some embodiments, the GaAs layer can be part of a collector of a heterojunction bipolar transistor (HBT).

In some implementations, the present disclosure relates to a heterojunction bipolar transistor (HBT) that includes a semi-insulating gallium arsenide (GaAs) substrate, a GaAs collector layer disposed over the substrate, a base layer disposed over the collector, and an emitter layer disposed over the base layer. The HBT further includes a metal contact disposed relative to the collector layer such that the metal contact and the collector layer form a Schottky diode. The HBT further includes a tantalum nitride (TaN) layer disposed between the metal contact and the collector so as to reduce the turn-on voltage of the Schottky diode.

In some embodiments, the HBT can further include a sub-collector layer disposed between the collector layer and the GaAs substrate. In some embodiments, the sub-collector layer can include n+ GaAs, the collector layer can include n− GaAs, the base layer can include p+ GaAs, and the emitter layer can include n− InGaP.

In accordance with an number of implementations, the present disclosure relates to a gallium arsenide (GaAs) die having an integrated circuit (IC). The die includes a metallization structure that includes a GaAs layer; a tantalum nitride (TaN) layer disposed over the GaAs layer; and a metal layer disposed over the TaN layer.

In some embodiments, the metallization structure can be part of a Schottky diode. In some embodiments, the GaAs layer can be a collector layer of a heterojunction bipolar transistor.

In a number of implementations, the present disclosure relates to a packaged module that includes a packaging substrate and a gallium arsenide (GaAs) die mounted on the packaging substrate and having an integrated circuit (IC). The die includes a metallization structure that includes a GaAs layer; a tantalum nitride (TaN) layer disposed over the GaAs layer; and a metal layer disposed over the TaN layer.

According to some implementations, the present disclosure relates to a radio-frequency (RF) device that includes an antenna and a transceiver coupled to the antenna and configured to process RF signals. The RF device further includes an integrated circuit (IC) that is coupled to or is part of the transceiver and implemented on a gallium arsenide (GaAs) die. The IC includes a metallization structure that includes a GaAs layer; a tantalum nitride (TaN) layer disposed over the GaAs layer; and a metal layer disposed over the TaN layer.

In some implementations, the present disclosure relates to a method for fabricating a Schottky diode. The method includes forming or providing a gallium arsenide (GaAs) layer. The method further includes forming a tantalum nitride (TaN) layer over the GaAs layer, and forming a metal layer over the TaN layer.

According to a number of implementations, the present disclosure relates to a method for fabricating a heterojunction bipolar transistor (HBT). The method includes providing or forming a semi-insulating gallium arsenide (GaAs) substrate, and forming a GaAs collector layer over the substrate. The method further includes forming a tantalum nitride (TaN) layer over the collector layer, and forming a metal layer over the TaN layer such that the metal layer, TaN layer and the GaAs collector layer form a Schottky diode. The method further includes forming a base and an emitter. In some embodiments, the HBT can include an NPN HBT.

In some implementations, the present disclosure relates to a metallization structure that includes an extrinsic gallium based semiconductor layer, a metal layer, and a tantalum nitride (TaN) layer disposed between the metal layer and the gallium based semiconductor layer. In some embodiments, the gallium based semiconductor layer can include a GaAs layer.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

GaAs (gallium arsenide) heterojunction bipolar transistors (HBT) are widely used for wireless applications since they have excellent features such as high power density and high efficiency. In typical GaAs HBT (or BiFET (bipolar field effect transistor)) processes, Schottky diode turn-on voltage is about 0.7V. For some applications (e.g., diode drops, detectors), a lower turn-on voltage may be desirable. Described herein are devices and methods that can significantly lower the turn-on voltage when implemented in GaAs such as n-type GaAs.

In some situations, a low turn-on Schottky diode can be configured as a planar doped barrier diode. However, such a design typically involves materials generally not compatible with fabrication of HBTs. Other barrier-lowering schemes can involve growth of thin layer of opposite doping polarity, which is again generally not compatible with HBT processes.

Described herein are devices and methods related to a GaAs based structure that can be configured as, or behave similar to, a Schottky diode. As also described herein, such a diode can be utilized in a number of applications, including any devices and/or circuits where a Schottky diode with a relatively low turn-on voltage is desired. For example, radio-frequency (RF) mixers and detector diodes can benefit due to such a diode's low turn-on voltage and high switching speed. Further, such a diode's low forward voltage drop can result in less power being wasted, thereby making the devices more efficient. Such a feature can be advantageous in a number of analog circuit designs.

In another example, a Schottky diode design having one or more features described herein can be implemented as clamp diodes configured for voltage references. Such a diode can be used by itself or in combinations with any other Schottky and/or heterojunction diodes to generate various voltage references. By way of an example, a Schottky diode described herein can have a clamp voltage of about 0.4V while a regular Schottky has a typical voltage of about 0.7V. Such diodes in series can yield a voltage of about 1.1V (which is an intermediate value typically not attainable with any combination of regular Schottky diodes) if desired. Such a feature can be advantageous in a number of analog and power amplifier designs.

In yet another example, a Schottky diode design having one or more features described herein can be implemented in photoelectric cells such as solar cells (sometimes also referred to as photovoltaic cells) where the relatively low turn-on voltage can be desirable. Other circuits and/or devices can also benefit from a Schottky diode design as described herein. Thus, although various examples of devices, circuits, processes and methods are described herein in the context of GaAs HBTs, it will be understood that one or more concepts described herein can also be applied to other devices, circuits, processes and/or methods.

Described herein are devices and methods related to a metallization structure that behaves as a Schottky diode having a relatively low turn-on voltage. Examples of such turn-on voltages are described herein in greater detail.

In some implementations, a TaN (tantalum nitride) structure (such as a layer) can be added as part of an anode metallization below a first metal (M1) anode contact for a collector of a GaAs HBT. Such an addition of the TaN layer can lower the turn-on voltage of the resulting diode from about 0.7V to about 0.42V. As described herein, such a metallization structure can be utilized to facilitate a low turn-on functionality associated with a structure that can be fabricated using a process for fabricating the HBT. In some implementations, such a metallization structure can also be utilized separate from the HBT context.

Although described in the context of TaN material, it will be understood that materials having similar properties can also be utilized. For example, TiN (titanium nitride) and NbN (niobium nitride) are metal nitride materials that can also be utilized in similar applications, including GaAs processes. In the context of TaN material, its work function in GaAs processes facilitates lowering of the Schottky barrier height. Similarly, although described in the context of HBT process, it will be understood that one or more features of the present disclosure can also be implemented in other semiconductor structures and processes.

Figure 1A:
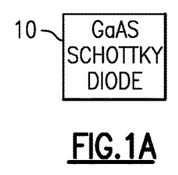
FIGS. 1A and 1B schematically depict a Schottky diode and a heterojunction bipolar transistor (HBT) having one or more features as described herein.

FIG. 1A schematically shows that one or more features associated with the present disclosure can be implemented as a Schottky diode 10. In some embodiments, such a diode can have a relatively low turn-on voltage of about 0.42V which is about 40% lower than the typical value of about 0.7V. In some embodiments, a Schottky diode having one or more features as described herein can have a turn-on voltage that is less than about 0.6V, less than about 0.5V, less than about 0.45V, less than or equal to about 0.42V, or less than or equal to about 0.4V.

Figure 1B:
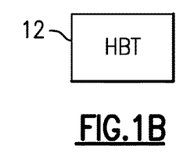

FIG. 1B schematically shows that one or more features related to the Schottky diode as described herein can be implemented in an HBT 12. In some embodiments, such an HBT can have a collector whose metalized contact includes a layer of TaN between the M1 metal and the collector layer.

Figure 2:
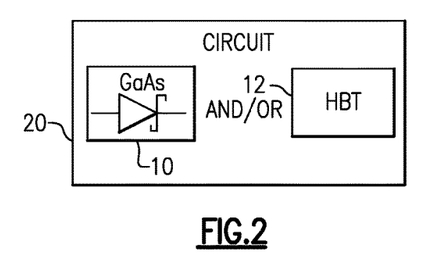
FIG. 2 shows that in some implementations, a circuit can include the Schottky diode and/or the HBT of FIG. 1.

FIG. 2 shows that in some embodiments, a GaAs Schottky diode 10 and/or an HBT 12 having one or more features as described herein can be implemented in a circuit (e.g., an integrated circuit (IC)) 20. In the context of the HBT 12, the circuit 20 can include circuits that utilize HBTs. For example, the circuit 20 can include radio-frequency (RF) related circuits.

Figure 3A:
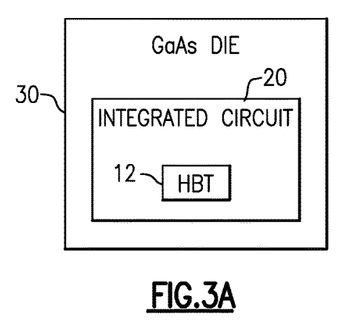
FIG. 3A shows that one or more circuits of FIG. 2 having the HBT can be implemented on a semiconductor die such as a GaAs die.

FIG. 3A shows that in some embodiments, one or more circuits of FIG. 2 can be implemented as an integrated circuit (IC) 20 formed on a GaAs die 30. In the example shown, the IC 20 is depicted as including an HBT 12 having one or more features described herein. In some embodiments, the die 30 can be configured for mounting onto a substrate such as a laminate to accommodate wirebond or flip-chip connections.

Figure 3B:
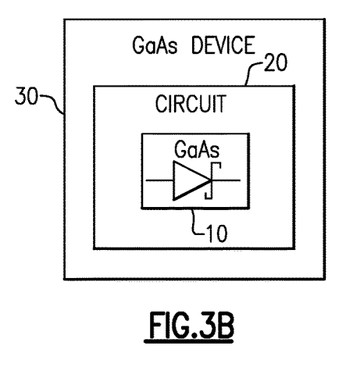
FIG. 3B shows that one or more circuits of FIG. 2 having the Schottky diode can be implemented on a semiconductor device such as a GaAs device.

FIG. 3B shows that in some embodiments, one or more circuits of FIG. 2 can be implemented as a circuit 20 that is part of a GaAs device 32. In the example shown, the circuit 20 is depicted as including a GaAs Schottky diode 10 having one or more features described herein.

Figure 4A:
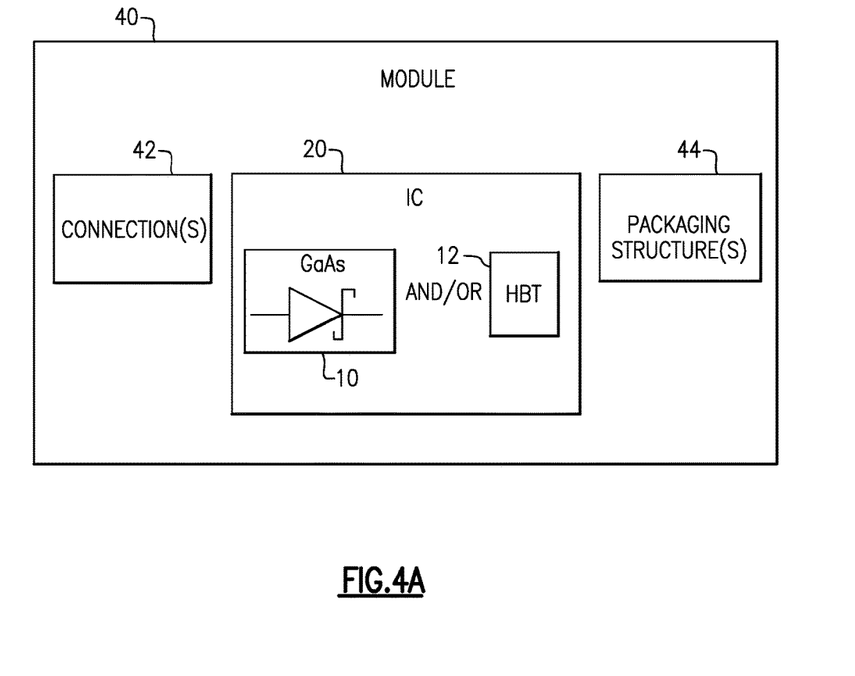
FIG. 4A schematically shows that in some implementations, a packaged module can include one or more circuits of FIG. 2.

FIG. 4A schematically shows that in some embodiments, an IC 20 having a GaAs Schottky diode 10 and/or an HBT 12 as described herein can be implemented in a packaged module 40. In some embodiments, such an IC can be implemented on a die (e.g., die 30 of FIG. 3A). The module 40 can further include one or more packaging structures 44 that provide, for example, a mounting substrate and protection for the IC 20. The module 40 can further include connection features 42 such as connectors and terminals configured to provide electrical connections to and from the IC 20.

Figure 4B:
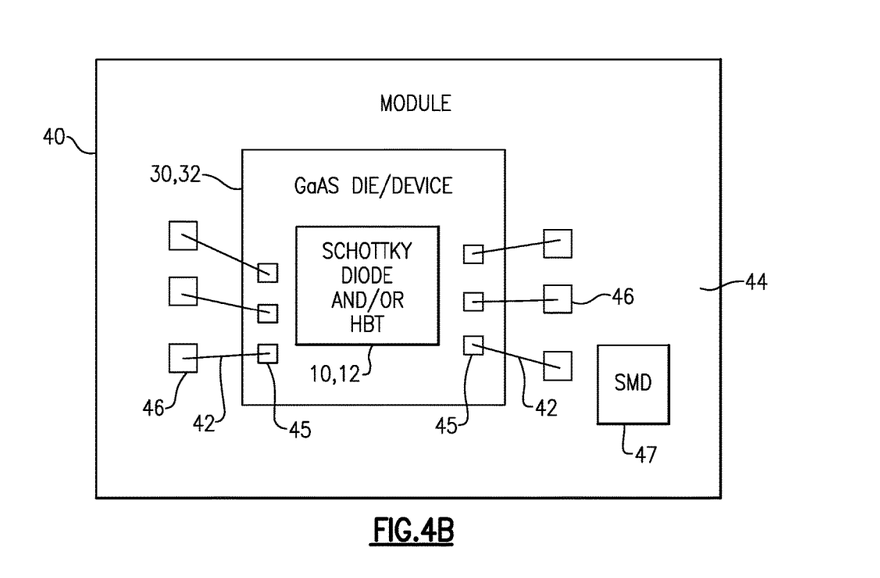
FIGS. 4B and 4C show different views of a more specific example of the packaged module of FIG. 4A.
Figure 4C:
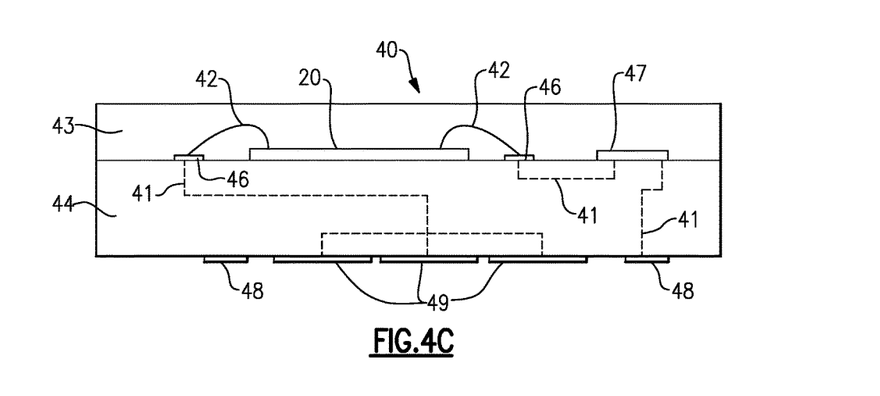

FIGS. 4B and 4C show a plan view and a side view of a module 40 that can be a more specific example of the module 40 of FIG. 4A. The example module 40 can include a packaging substrate 44 that is configured to receive a plurality of components. In some embodiments, such components can include a GaAs die 30 or a GaAs device 32 having one or more featured as described herein. For example, the die/device 30, 32 can include an HBT and/or a Schottky diode having one or more features described herein. In some embodiments, such an HBT and/or a Schottky diode can be part of one or more circuits or devices describe herein. A plurality of connection pads 45 formed on the die/device 30, 32 can facilitate electrical connections such as wirebonds 42 to connection pads 46 on the substrate 44 to facilitate passing of various signals to and from the die/device 30, 32.

In some embodiments, the components mounted on the packaging substrate 44 or formed on or in the packaging substrate 44 can further include, for example, one or more surface mount devices (SMDs) (e.g., 47) and one or more matching networks (not shown). In some embodiments, the packaging substrate 44 can include a laminate substrate.

In some embodiments, the module 40 can also include one or more packaging structures to, for example, provide protection and facilitate easier handling of the module 40. Such a packaging structure can include an overmold 43 formed over the packaging substrate 44 and dimensioned to substantially encapsulate the various circuits and components thereon.

It will be understood that although the module 40 is described in the context of wirebond-based electrical connections, one or more features of the present disclosure can also be implemented in other packaging configurations, including flip-chip configurations.

Figure 5A:
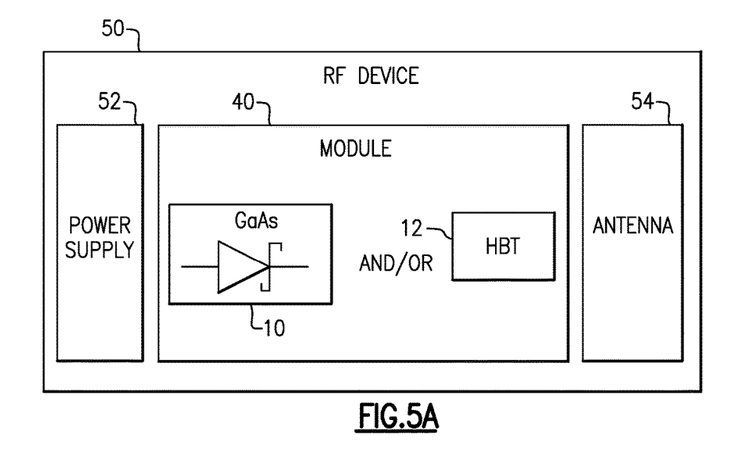
FIG. 5A schematically shows that in some implementations, a radio-frequency (RF) device such as a wireless device can include the module of FIG. 4.

FIG. 5A schematically shows that in some embodiments, a component such as the module 40 of FIG. 4 can be included in an RF device 50. Such an RF device can include a wireless device such as a cellular phone, smart phone, tablet, or any other portable device configured for voice and/or data communication. In FIG. 5A, the module 40 is depicted as including a GaAs Schottky diode 10 and/or an HBT 12 as described herein. The RF device 50 is depicted as including other common components such an antenna 54, and also configured to receive or facilitate a power supply 52 such as a battery.

Figure 5B:
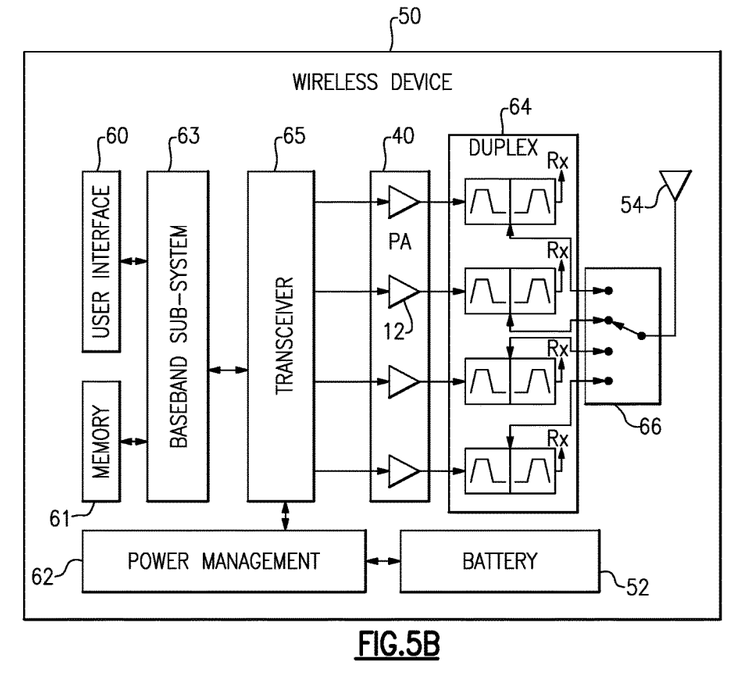
FIG. 5B shows a more specific example of a wireless device.

FIG. 5B shows a more specific example of how the wireless device 50 of FIG. 5A can be implemented. In FIG. 5B, an example wireless device 50 is shown to include a module 40 (e.g., a PA module) having one or more features as described herein. For example, the PA module 40 can include a plurality of HBT power amplifiers 12 configured to provide amplifications for RF signals associated with different bands and/or modes. In another example, an RF mixer and/or a detector diode can be implemented in the wireless device to provide, for example mixing and power detection functionalities.

In the example wireless device 50, the PA module 40 can provide an amplified RF signal to the switch 66 (via a duplexer 64), and the switch 66 can route the amplified RF signal to an antenna 54. The PA module 40 can receive an unamplified RF signal from a transceiver 65 that can be configured and operated in known manners. The transceiver 65 can also be configured to process received signals. The transceiver 65 is shown to interact with a baseband sub-system 63 that is configured to provide conversion between data and/or voice signals suitable for a user and RF signals suitable for the transceiver 65. The transceiver 65 is also shown to be connected to a power management component 62 that is configured to manage power for the operation of the wireless device 50. Such a power management component can also control operations of the baseband sub-system 63 and other components of the wireless device 50.

The baseband sub-system 63 is shown to be connected to a user interface 60 to facilitate various input and output of voice and/or data provided to and received from the user. The baseband sub-system 63 can also be connected to a memory 61 that is configured to store data and/or instructions to facilitate the operation of the wireless device, and/or to provide storage of information for the user.

In some embodiments, the duplexer 64 can allow transmit and receive operations to be performed simultaneously using a common antenna (e.g., 54). In FIG. 5B, received signals are shown to be routed to "Rx" paths (not shown) that can include, for example, a low-noise amplifier (LNA).

The example duplexer 64 is typically utilized for frequency-division duplexing (FDD) operation. It will be understood that other types of duplexing configurations can also be implemented. For example, a wireless device having a time-division duplexing (TDD) configuration can include respective low-pass filters (LPF) instead of the duplexers, and the switch (e.g., 66 in FIG. 5B) can be configured to provide band selection functionality, as well as Tx/Rx (TR) switching functionality.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 6:
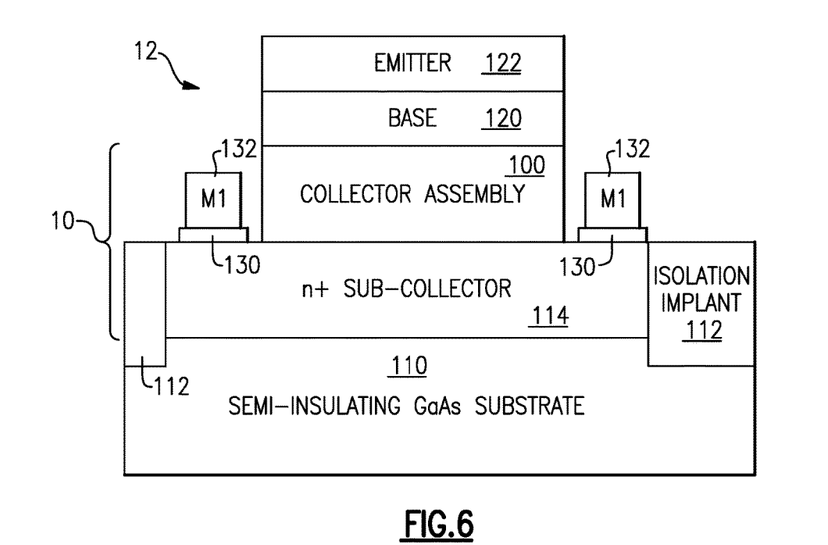
FIG. 6 shows an example configuration of an HBT structure.

FIG. 6 shows an example of an HBT 12 structure having a collector assembly 100. Additional details concerning examples of how the collector assembly 100 can be configured to yield a Schottky diode are described herein in reference to FIGS. 7 and 8. In the context of an HBT, the collector assembly 100 can include a collector layer that is formed over a sub-collector 114 (such as an n+ sub-collector) which in turn can be formed over a semi-insulating GaAs substrate 110. Collector contacts 130 are shown to be formed on the sub-collector 114, and M1 metals 132 are shown to be formed on the collector contacts 130. As described in greater detail in reference to FIGS. 7 and 8, such an electrical contact can be utilized as an electrode for the Schottky diode. Isolation implant regions 112 can be provided so as to provide electrical isolation from one or more neighboring devices (not shown).

FIG. 6 further shows that a base 120 can be formed over the collector assembly 100. An emitter 122 can be formed on the base 120 so as to yield the HBT structure 12. Appropriate electrical contacts can be formed for the base 120 and the emitter 122 to facilitate the operation of the HBT 12.

The example HBT structure 12 described in reference to FIG. 6 can be an NPN GaAs HBT. One or more features of the present disclosure can also be implemented in other configurations such as a PNP GaAs HBT.

Figure 7:
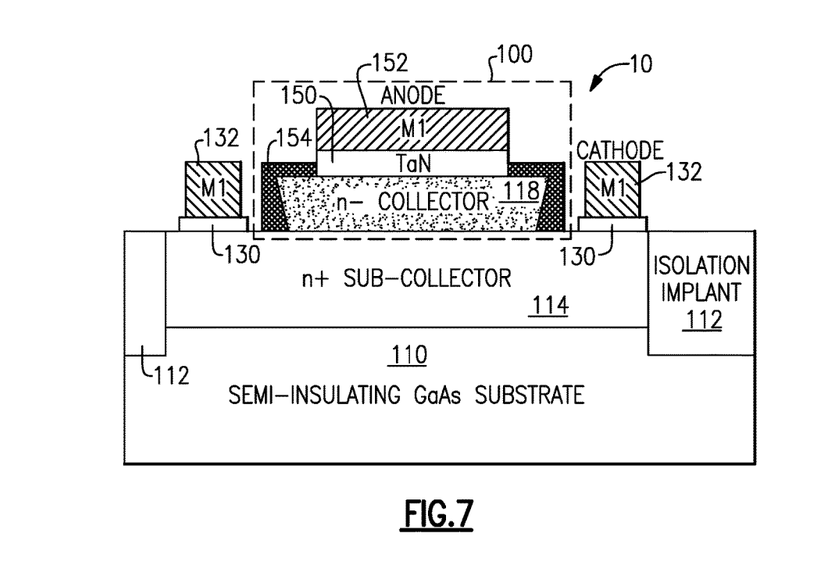
FIG. 7 shows that in some embodiments, a process for fabricating the HBT of FIG. 6 can be utilized to form a structure where a tantalum nitride (TaN) layer is shown to be positioned between a collector layer and an M1 anode metal layer.

FIG. 7 shows an example configuration of the GaAs Schottky diode 10 referred to in FIG. 6. For the purpose of description, the diode 10 can be formed on a semi-insulating GaAs substrate 110. A sub-collector layer 114 (e.g., n+ GaAs) can be formed over the GaAs substrate 110. Collector contacts 130 can be formed on the sub-collector 114, and M1 metals 132 can be formed on the collector contacts 130. In some embodiments, such an electrical contact assembly can act as a cathode of the Schottky diode 10. Isolation implant regions 112 can be provided so as to provide electrical isolation from one or more neighboring devices (not shown).

FIG. 7 further shows that the collector assembly 100 of FIG. 6 can include a collector layer 118 (e.g., n− GaAs) formed over the sub-collector layer 114. Metallization of the collector layer 118 to yield an anode of the Schottky diode 10 can be achieved as follows. A tantalum nitride (TaN) layer 150 can be formed over the collector layer 118; and an M1 metal layer 152 can be formed over the TaN layer 150 to function as the anode. In some implementations, there may be a passivation structure 154 (e.g., nitride) covering the collector layer 118. In such a case, TaN formation process can etch away the nitride so as to facilitate contact between the TaN layer 150 and the collector layer 118.

In some embodiments, as described in reference to FIGS. 6 and 7, an appropriately configured Schottky diode structure 10 can be fabricated utilizing some of the processes used to fabricate an HBT structure 12. In some embodiments, the Schottky diode structure 10 of FIG. 7 fabricated as described herein can be implemented in an integrated circuit as a device having a low turn-on voltage characteristic, with or without an HBT resulting from the same HBT process.

Figure 8:
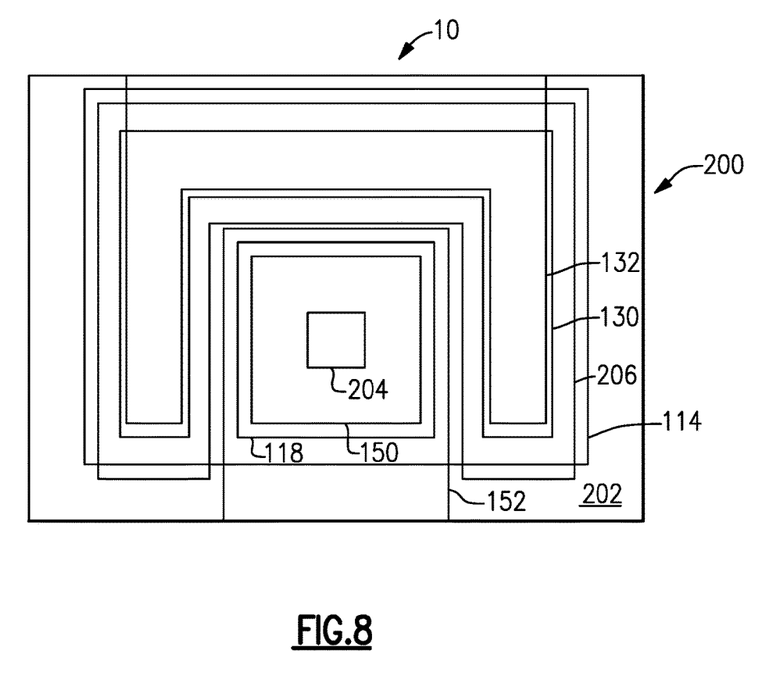
FIG. 8 shows a layout view of the example structure of FIG. 7.

FIG. 8 shows a layout view of the Schottky diode structure 10 of FIG. 7. A sub-collector layer 114 is depicted as being a rectangular shaped region formed over an underlying layer 202 (e.g., GaAs substrate 110 in FIG. 7). A collector contact 130 and a corresponding M1 layer 132 are depicted as having footprints in an inverted-U shape. To facilitate such structures, a via 206 having a similar inverted-U shape can be provided.

FIG. 8 further shows that a collector layer 118 is depicted as being over the sub-collector layer 114, and dimensioned as a rectangular region that is nested generally within the inverted-U shape of the M1 metal layer 132. A TaN layer 150 is depicted as being over the collector layer 118 and having a rectangular shaped footprint. An M1 metal layer 152 is depicted as being over the TaN layer 150 and having a rectangular shaped footprint.

In the context of TaN material, the foregoing TaN barrier layer 150 can be formed over the collector 118 using deposition methods such as physical vapor deposition (PVD) such as sputtering, evaporation, chemical vapor deposition (CVD), metal organic CVD (MOCVD), plasma assisted CVD (PACVD), and metal organic atomic layer deposition (MOALD). Such a TaN barrier layer can have a thickness in a range of, for example, 10 nm to 200 nm, 20 nm to 100 nm, 30 nm to 70 nm, or 40 nm to 60 nm. In the various examples described herein, the TaN barrier layer has a thickness of about 50 nm.

Figure 9:
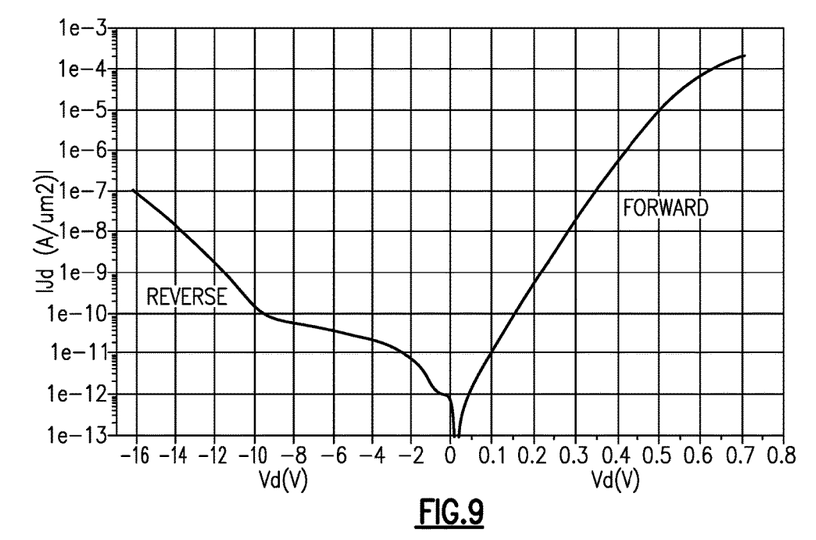
FIG. 9 shows forward and reverse I-V curves of a sample Schottky device having one or more features described herein.

FIG. 9 shows example forward and reverse I-V curves for a sample Schottky diode device having its anode metalized with TaN as described herein. On an I-V curve, the positive voltage corresponding to the current density of approximately $10^{-5}$ A/$\mu^2$ is typically considered to be the turn-on voltage. Thus, for the example shown in FIG. 9, such a turn-on voltage is shown to occur at about 0.5V which is significantly lower than those (about 0.7V or higher) corresponding to Schottky diodes without the TaN layer in their anodes.

Figure 10:
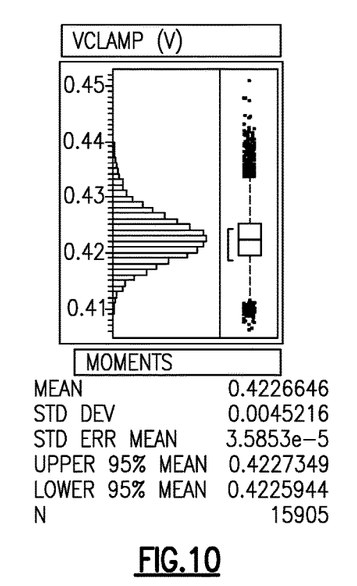
FIG. 10 shows a clamp voltage distribution for a sample Schottky device having one or more features described herein.

FIG. 10 shows a distribution of measured turn-on voltages (indicated as Vclamp) for a sample Schottky diode device having its anode metalized with TaN as described herein. Such measurements were obtained when the current density was about $10^{-5}$ A/$\mu m^2$. In this example, the distribution shows an average turn-on voltage value of about 0.42V. Again, such a value is significantly lower than turn-on voltages corresponding to Schottky diodes without the TaN layer in their anodes.

As described herein, a Schottky diode having a TaN layer between a metal layer and GaAs can be configured to yield a relatively low turn-on voltage. For example, such a metal-TaN—GaAs structure can have a turn-on voltage that is less than or equal to, for example, 0.65V, 0.6V, 0.55V, 0.5V, 0.45V, 0.42V, or even lower.

In some embodiments, Schottky diodes having anodes metalized with TaN as described herein can have a favorable ideality factor that is close to 1. In some embodiments, such Schottky diodes can have an increased saturation current values. Such an effect may be due to the lower turn-on voltage and comparable ideality factor as other Schottky diodes.

Figures 11, 12:
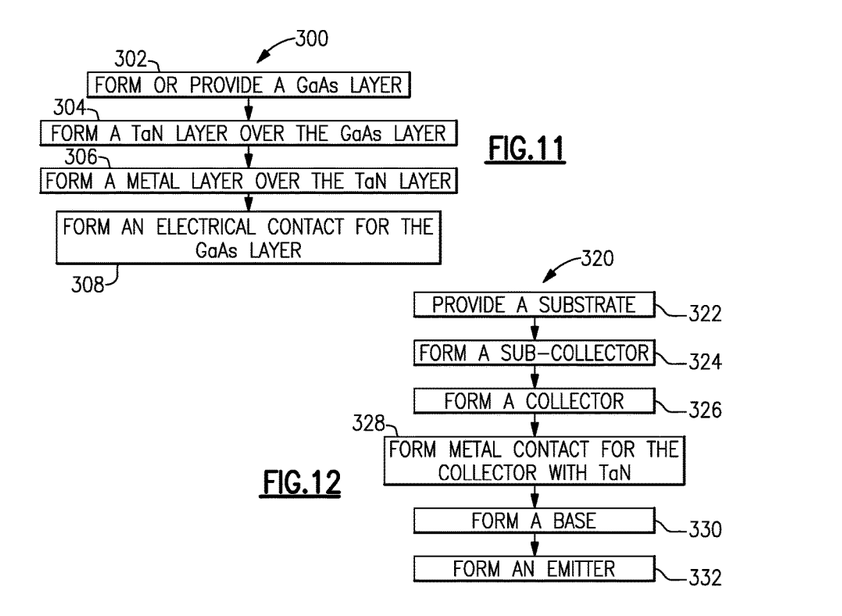
FIG. 11 shows a process that can be implemented to fabricate the example Schottky structure of FIGS. 7 and 8.
FIG. 12 shows a process that can be implemented to fabricate the example HBT structure of FIG. 6.

FIG. 11 shows a process 300 that can be implemented to fabricate a Schottky diode having one or more features as described herein. In block 302, a GaAs semiconductor layer can be formed or provided. In some implementations, such a layer can include an n− GaAs layer. In block 304, a TaN layer can be formed over the GaAs layer. In block 306, a metal layer can be formed over the TaN layer. In block 308, an electrical contact for the GaAs layer can be formed. In some implementations, the metal layer over the TaN layer can act as an anode of the resulting Schottky diode, and the electrical contact for the GaAs layer can act as a cathode.

In some implementations, the GaAs semiconductor layer formed or provided in block 302 of the process 300 can be a collector layer formed utilizing an HBT process. For example, the collector (e.g., n− GaAs) can be formed over a sub-collector (e.g., n+ GaAs) which is in turn over a substrate (e.g., semi-insulating GaAs).

FIG. 12 shows a process 320 that can be implemented to fabricate an HBT or a Schottky structure having one or more features as described herein. In block 322, a substrate can be formed or provided. In some embodiments, such a substrate can include a semi-insulating GaAs substrate. In block 324, a sub-collector layer can be formed over the substrate. In some implementations, such a sub-collector layer can include n+ GaAs. In block 326, a collector layer can be formed over the sub-collector layer. In some implementations, such a collector layer can include n− GaAs. For the Schottky structure, a metal contact with TaN can be formed on the collector layer in block 328. For the HBT structure, the process 320 can bypass block 328; and in block 330, a base layer can be formed over the collector layer. In such a configuration, the TaN layer is not present between the collector and base layers. In some implementations, such a base layer can include p+ GaAs. In block 332, an emitter layer can be formed over the base layer. In some implementations, such an emitter layer can include n− InGaP.

Figure 13:
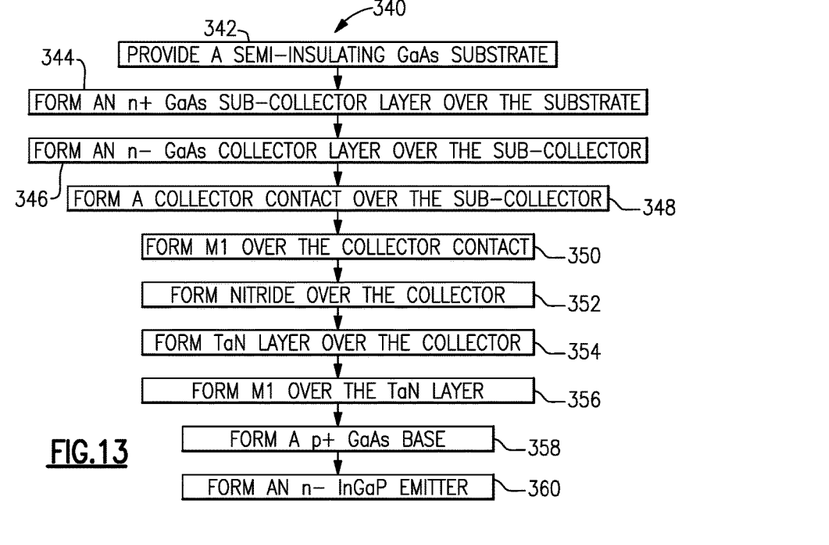
FIG. 13 shows a process that can be implemented as a more specific example of the process of FIG. 12.

FIG. 13 shows a process 340 that can be implemented as a more specific example of the process 320 of FIG. 12. In block 342, a semi-insulating GaAs substrate can be provided. In block 344, an n+ GaAs sub-collector layer can be formed over the substrate. In block 346, an n− GaAs collector layer can be formed over the sub-collector layer. In block 348, a collector contact can be formed over the sub-collector layer. In block 350, an M1 metal layer can be formed over the collector contact. For the Schottky structure, a nitride passivation layer can be formed so as to substantially cover the collector layer in block 352. An opening can be formed in the nitride passivation layer to allow formation of a TaN layer over the collector layer. In block 354, a TaN layer can be formed over the collector layer. In block 356, an M1 metal layer can be formed over the TaN layer. For the HBT structure, the process 340 can bypass blocks 352, 354 and 356; and in block 358, a p+ GaAs base layer can be formed. In block 360, an n− InGaP emitter layer can be formed over the base layer.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of fabricating a semiconductor structure, the method comprising:
    forming a sub-collector layer over a gallium arsenide substrate;
    forming a collector layer over and in physical contact with the sub-collector layer; and
    forming a tantalum nitride layer over the collector layer, the tantalum nitride layer including a top surface and a bottom surface, and an entirety of the bottom surface being planar and in physical contact with the collector layer.

2. The method of claim 1, further comprising: forming a first electrical contact on the tantalum nitride layer and a second electrical contact on the sub-collector layer to yield a Schottky diode with the first electrical contact being an anode and the second electrical contact being a cathode.

3. The method of claim 1, wherein the tantalum nitride layer, the collector layer, and the sub-collector layer are included in a Schottky diode.

4. The method of claim 3, wherein the Schottky diode has a turn-on voltage of less than or equal to 0.45 Volts.

5. The method of claim 3, further comprising: forming a cathode of the Schottky diode, the cathode including an electrical contact contacting the sub-collector layer on opposing side of the collector layer.

6. The method of claim 3, further comprising: forming an anode of the Schottky diode on the tantalum nitride layer.

7. The method of claim 1, further comprising: forming a passivation layer such that the tantalum nitride layer and the passivation layer are in physical contact with and fully cover the collector layer opposite the sub-collector layer.

8. The method of claim 1, further comprising: forming an isolation implant region having a surface that is co-planar with a surface of the sub-collector layer.

9. A method of fabricating a Schottky diode, the method comprising:
    forming a doped gallium arsenide layer over a second doped gallium arsenide layer;
    forming a tantalum nitride layer over the doped gallium arsenide layer, the tantalum nitride layer including a top surface and a bottom surface, and an entirety of the bottom surface being in physical contact with the doped gallium arsenide layer;
    forming a passivation structure such that the tantalum nitride layer and the passivation structure are in physical contact with and fully covering the doped gallium arsenide layer opposite the second doped gallium arsenide layer; and
    forming a cathode in physical contact with the second doped gallium arsenide layer on opposing sides of the tantalum nitride layer; the doped gallium arsenide layer, the tantalum nitride layer, and the cathode layer being included in the Schottky diode.

10. The method of claim 9, further comprising: forming an anode of the Schottky diode on the tantalum nitride layer.

11. The method of claim 9, wherein the cathode has an inverted-U shaped footprint.

12. The method of claim 9, wherein the Schottky diode has a turn-on voltage of less than 0.45 Volts.

13. The method of claim 9, wherein the Schottky diode has a turn-on voltage of about 0.42 Volts.

14. The method of claim 9, wherein the doped gallium arsenide layer is a collector layer, and the second doped gallium arsenide layer is a sub-collector layer.

15. A method of fabricating a semiconductor structure, the method comprising:
    forming a doped gallium arsenide layer over and in physical contact with a second doped gallium arsenide layer;
    forming a tantalum nitride layer over the doped gallium arsenide layer, the tantalum nitride layer including a top side and a bottom side, and an entirety of the bottom side of the tantalum nitride layer being planar and in physical contact with the doped gallium arsenide layer; and
    forming a first electrical contact on the tantalum nitride layer and a second electrical contact on the second doped gallium arsenide layer such that the first electrical contact is an anode of a Schottky diode and the second electrical contact is a cathode of the Schottky diode.

16. The method of claim 15, wherein the Schottky diode has a turn on voltage of less than 0.5 Volts.

17. The method of claim 15, wherein the cathode has an inverted-U shaped footprint.

18. The method of claim 15, further comprising:
    forming a passivation layer such that the tantalum nitride layer and the passivation layer are in physical contact with and fully cover the doped gallium arsenide layer opposite the second doped gallium arsenide layer.

19. The method of claim 15, further comprising: forming a cathode of the Schottky diode, the cathode including an electrical contact contacting the second doped gallium arsenide layer on opposing side of the doped gallium arsenide layer.

20. The method of claim 3, wherein the Schottky diode has a turn-on voltage of approximately 0.42 Volts.

* * * * *